United States Patent
Fetzer et al.

(10) Patent No.: US 6,388,489 B1
(45) Date of Patent: May 14, 2002

(54) LARGE INPUT FUNCTION REPLAYING DYNAMIC ENTRY LATCH WITH STATIC AND MONOTONIC DUAL RAIL OUTPUTS

(75) Inventors: Eric S Fetzer, Longmont; Gary J Benjamin, Fort Collins, both of CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/449,796

(22) Filed: Nov. 26, 1999

(51) Int. Cl.[7] .............................................. H03K 3/356
(52) U.S. Cl. ..................................... 327/210; 212/214
(58) Field of Search ......................... 327/108–112, 170, 327/436, 437, 199–201, 208–212, 214; 326/82, 83

(56) References Cited

U.S. PATENT DOCUMENTS

| | | | | |
|---|---|---|---|---|
| 5,208,490 A | | 5/1993 | Yetter ............................ | 326/98 |
| 5,331,220 A | * | 7/1994 | Pierce et al. ................... | 326/82 |
| 5,546,355 A | | 8/1996 | Raatz et al. ................... | 365/233 |
| 5,646,556 A | * | 7/1997 | Longwell et al. ............. | 326/93 |
| 5,859,999 A | | 1/1999 | Morris et al. ................. | 395/565 |
| 5,860,017 A | | 1/1999 | Sharangpani et al. .. | 395/800.23 |
| 6,100,727 A | * | 8/2000 | Nomura ........................ | 327/112 |
| 6,166,564 A | * | 12/2000 | Rosen ............................ | 326/94 |
| 6,202,139 B1 | | 3/2001 | Witt et al. ..................... | 711/169 |

OTHER PUBLICATIONS

Wolfe, A., "Patents shed light on Merced's Innards", Electronic Engineering Times, Feb. 15, 1999.
WordNet 1.6, 1997 Princeton University, Pulse Generator: A generator of single or multiple voltage pulses; usually adjustable for pulse rate.

* cited by examiner

Primary Examiner—Kenneth B. Wells

(57) ABSTRACT

An a new dynamic logic entry latch or new "ELAT" and a method to capture a static input and convert it to a single rail dynamic signal with improved functionality and reduced clock and input load. The new ELAT utilizes a pulsed evaluate concept to enable more complex pull-down stack configurations and other improvements. The pulsed evaluate concept uses a pulse generators driven by the static input and a clock waveform to evaluate the static input and appropriately drive field effect transmitters on the pull-down stack. Utilizing multiple-input pulse generators or multiple pulse generators, the new ELAT can allow a wider variety of input functions and their inverses to be constructed without overloading the pull-down stack.

22 Claims, 10 Drawing Sheets

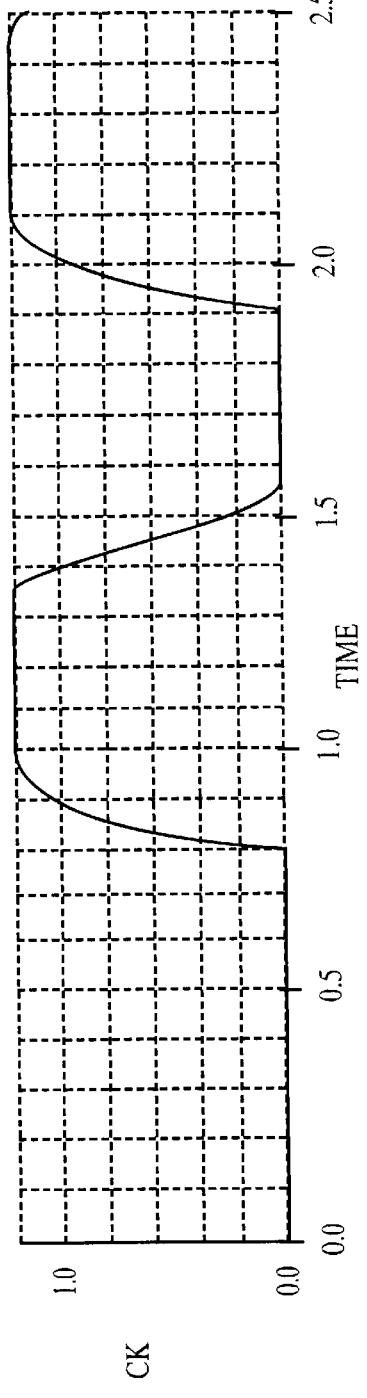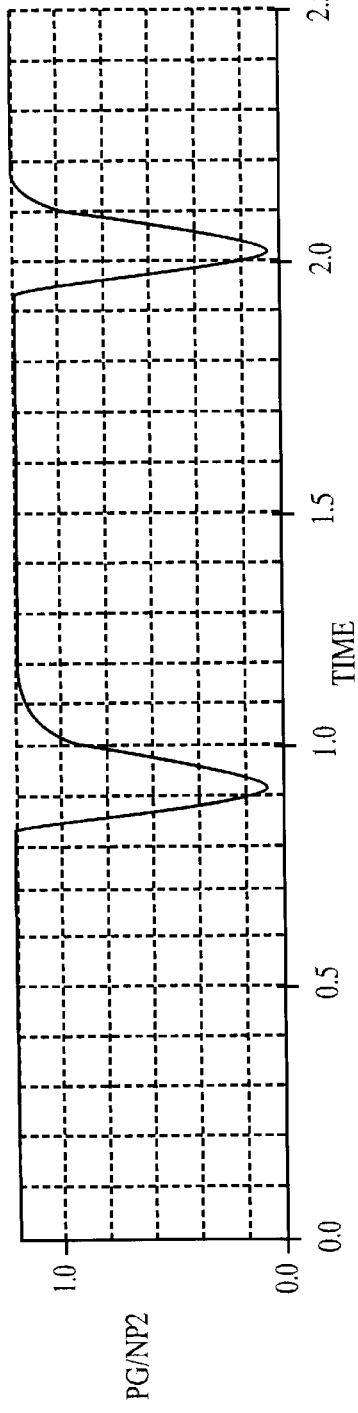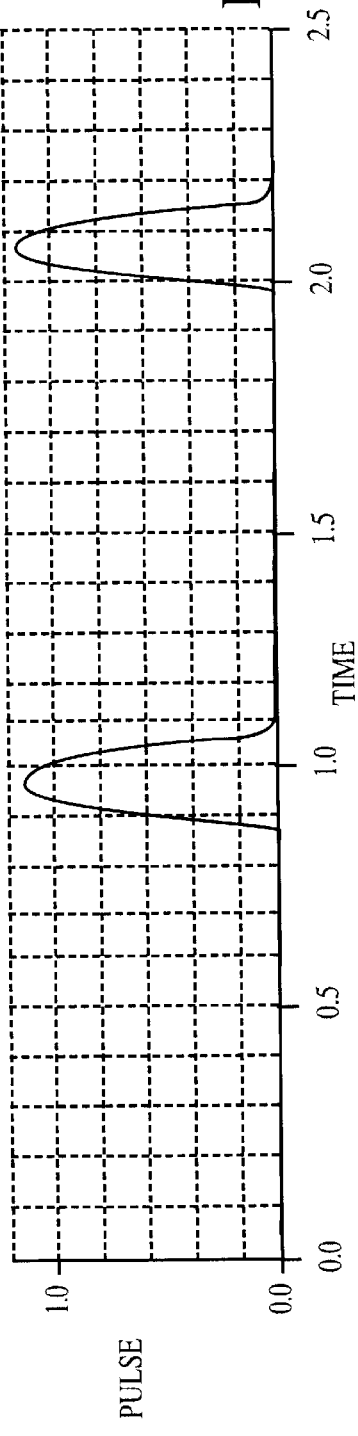

LARGE INPUT FUNCTION REPLAYING DYNAMIC ENTRY LATCH WITH STATIC AND MONOTONIC DUAL RAIL OUTPUTS

FIELD OF INVENTION

The invention relates to computers and processor systems. More particularly, this invention relates to the capturing and conversion of a static input into a dynamic signal for communicating between static and dynamic components within a microprocessor.

BACKGROUND OF THE INVENTION

In microprocessors, there are two classes of circuits: static circuits and dynamic circuits. While static circuits are generally low-power circuits, dynamic circuits are high-speed circuits, offering faster performance than static circuits. Since these two types of circuits are both found in microprocessors, there must exist a means for each type of circuit to communicate with the other type of circuit. A dynamic logic entry latch is such a means. The dynamic logic entry latch, or ELAT, captures a static input and converts it to a dynamic signal. Additional logical functions are built into ELAT circuits to allow more to be done in each clock cycle, which improves overall circuit performance. Unfortunately, existing ELAT topology allows for limited input functions due primarily to large pull-down stacks. Likewise, existing ELAT topology produces increasingly large input and clock loads as the functionality is increased.

SUMMARY OF THE INVENTION

The invention is an apparatus and method that captures a static input and converts it to a single rail dynamic signal with improved functionality and reduced clock and input load. More specifically, the apparatus is a new dynamic logic entry latch or new "ELAT". The new ELAT utilizes a pulsed evaluate concept to enable more complex pull-down configurations and other improvements.

The pulsed evaluate concept uses a pulse generator(s) driven by the static input(s) and the clock waveform to evaluate the static input(s) and appropriately drive a field effect transistor(s) ("FET") on the pull-down stack. Since the static input(s) and the clock waveform are evaluated by the pulse generator(s) and not directly by FETs on the pull-down stack, an equivalent function can be duplicated by the new ELAT with a smaller pull-down stack than in existing ELAT topology. Likewise, utilizing multiple-input pulse generators or multiple pulse generators, the new ELAT can allow a wider variety of input functions and their inverses to be constructed without over-loading the pull-down stack. For example, a six-input AND function can be implemented with three two-input pulse generators driving only three FETs on the pull-down stack.

Another advantage of the invention is that the pulse generators can be shared amongst ELATs in a multiple-bit ELAT scheme. This further increases efficiency and simplicity, reducing clock load and device size.

BRIEF DESCRIPTION OF THE DRAWINGS

FIGS. 6a–6e are a timing diagrams for the new ELAT in FIG. 2.

DETAILED DESCRIPTION OF THE INVENTION

The invention is a new dynamic logic entry latch ("ELAT"). The topology of the new ELAT allows for complex input functions, such as 6 wide AND or 8 wide OR. For similar functions, the performance of the new ELAT is the same as the current ELAT. However, the new ELAT allows for much wider input function than the current ELAT. For large input functions, the new ELAT reduces the number of logic gates on a critical path, thus increasing the performance of the final product. This is a result of the new ELAT's ability to pull greater functionality from upstream logic than the current ELAT. The new ELAT also has less clock and input load for a given function than that of current ELATs.

Figure 1:
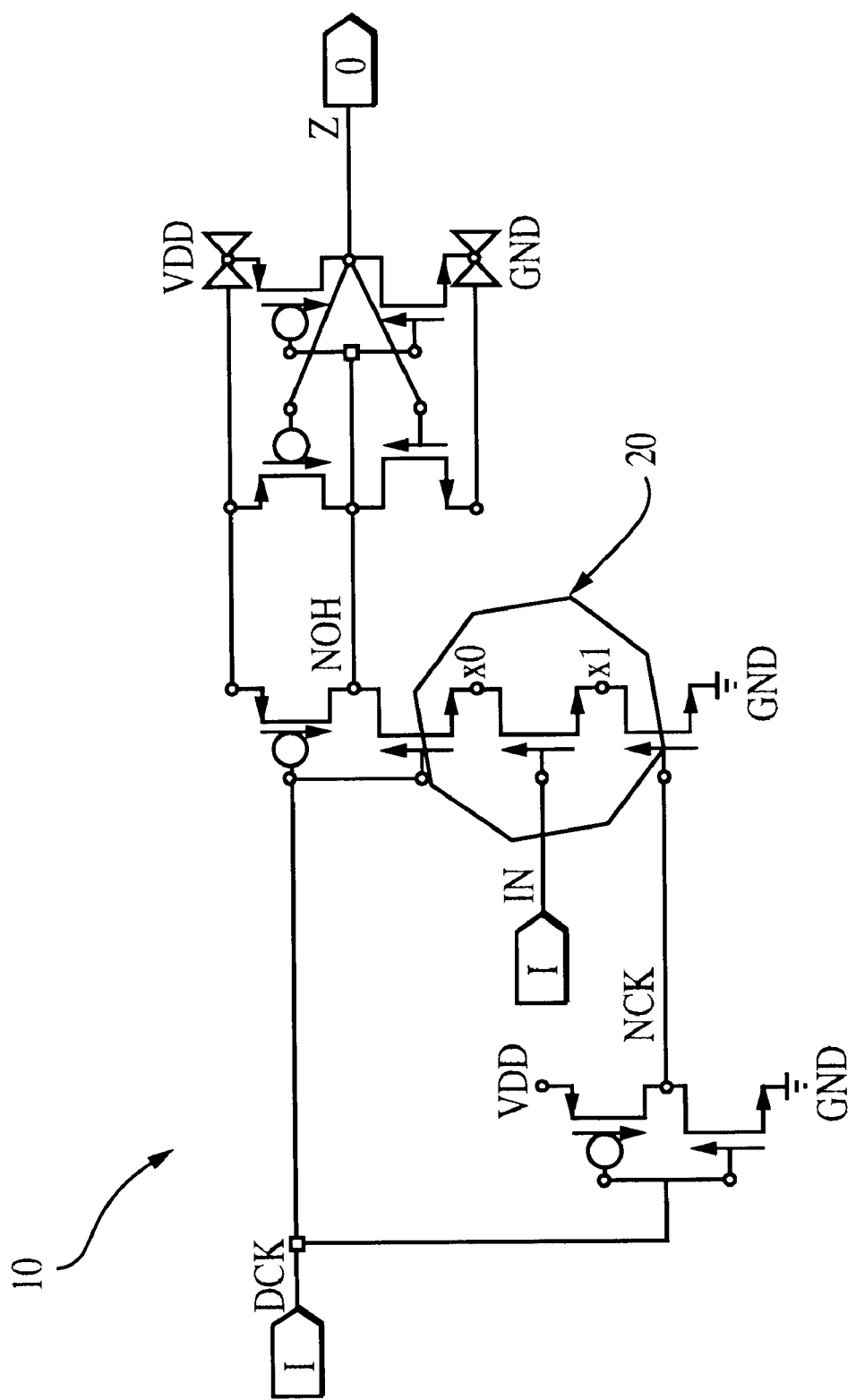
FIG. 1 is a logic block diagram of a prior art ELAT.

A current ELAT 10 is shown in FIG. 1. The ELAT 10 captures a static input IN and converts it to a single rail dynamic signal Z. Since the ELAT 10 topology relies on overlapping clocks (DCK and NDCK where NDCK is delayed by a controlled inversion) in a pull-down stack 20, a single input ELAT has three n-channel field effect transistors ("NFETs") in series (one NFET driven by the input and one NFET driven by each of the clocks DCK and NDCK). A clock waveform DCK also drives a FET between a power supply and a signal NOH. NOH in turn drives two FETs that in turn drive the output Z. The two FETs drive Z so that Z is the inverse of NOH, with a slight delay during the rising and falling of NOH. The output Z also feeds back to two FETs which act as a holder or latch for NOH, holding NOH at its current value. The hold only works when the evaluate (the NFETs pulling down) or pre-charge (p-channel field effect transmitters ("PFETs") pulling up) is not ON.

As seen in FIG. 1, the FETs on the pull-down stack 20 are between the signal path NOH and ground. Accordingly, when the FETs on the pull-down stack 20 are biased closed, the pull-down stack 20, and thus NOH, are grounded. The pull-down stack 20 is the critical path that largely determines the performance of the ELAT 10. The pull-down stack 20 is limited to at most 4 series-connected FETs. Unfortunately, the ELAT 10 topology requires 2 FETs for the clock structure alone, as seen in FIG. 1 and discussed above. This limitation in turn limits the possible input functions to 2-input OR and 2-input AND. Additionally, the input and clock loads grow large as the complexity or size of the function (the "functionality") of the ELAT 10 increases. This load growth is due to the increased number of FET's and logic gates necessary to produce a greater functionality.

Figure 2:
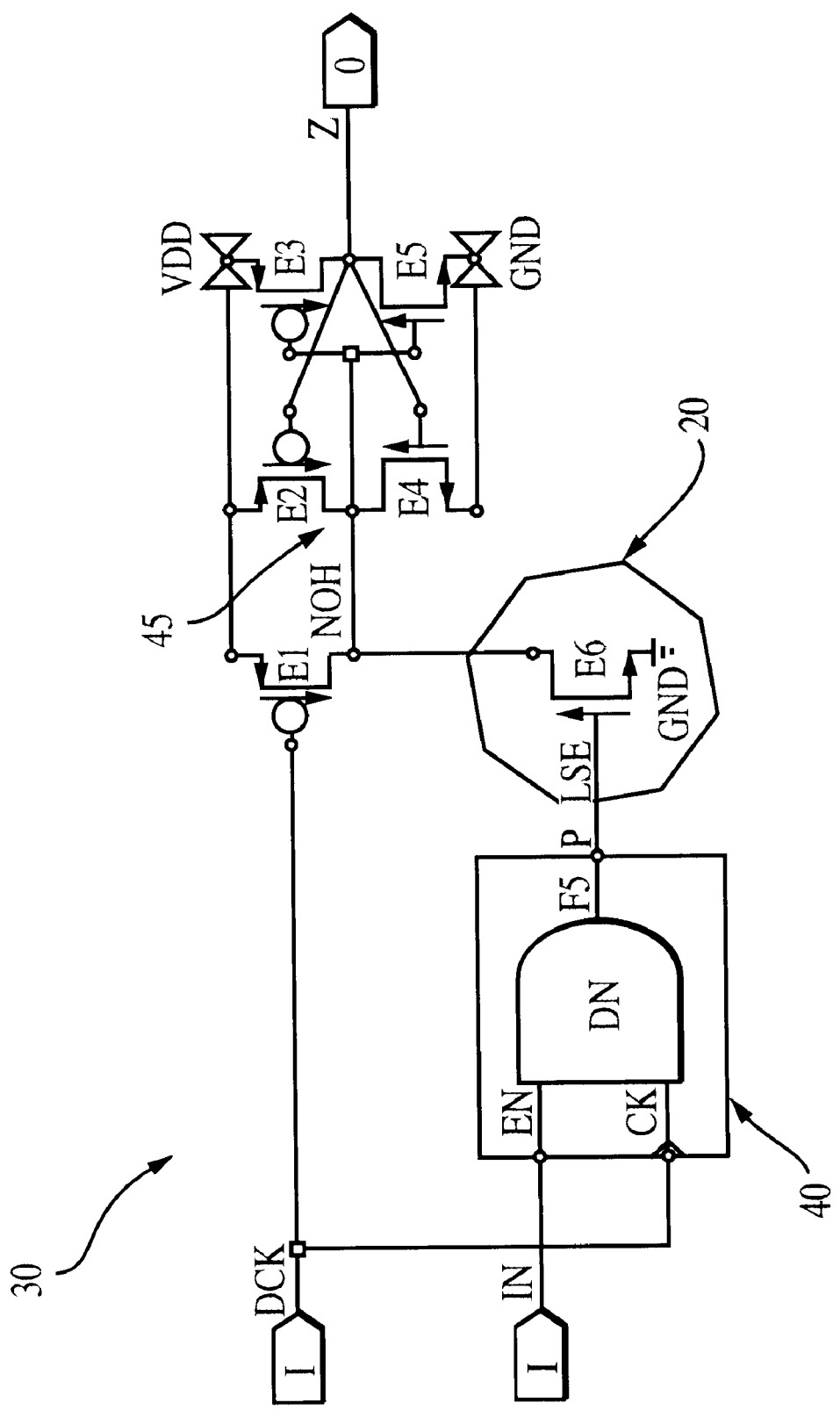
FIG. 2 is a logic block diagram of an embodiment of a new ELAT.

A new ELAT 30 is shown in FIG. 2. Like the ELAT 10, the new ELAT 30 captures a static input IN and converts it to a single rail dynamic signal Z. A clock waveform DCK also drives a FET between a voltage source and NOH. NOH in turn drives two FETs that in turn drive the output Z. The two FETs drive Z so that Z is the inverse of NOH, with a slight delay during the rising and falling of NOH. The output Z also feeds back to two FETs which act as a holder or latch for NOH, holding NOH at its current value.

The new ELAT 30 functions better than the ELAT 10 due to the reduced size of the pull-down stack 20' from NOH. For an equivalent function, the size of all FETs driving NOH, including the feedback and pre-charge FETs, is smaller than with the ELAT 10. Since the number and size of FETs is smaller in the new ELAT 30, input and clock load for an equivalent circuit are reduced, and/or more complex NFET pull-down configurations are enabled.

Instead of a large pull-down stack 20' from NOH, the new ELAT 30 in FIG. 2 has a pulse generator 40 driving a single NFET on the pull-down stack 20' from NOH. The pulse generator 40 is driven by the input signal IN, which acts as an enable signal, and the clock waveform DCK. Using the pulse generator 40 driven by the static input IN in this manner is called a pulsed evaluate concept or pulse evaluating. In other words, the pulse generator 40, or pulse generators as described below, evaluates the static input IN and the clock waveform DCK to enable the new ELAT 30 to produce the appropriate dynamic output signal Z. By using the pulsed evaluate concept and pulling the input IN back from the pull-down stack 20', the functionality of the new ELAT 30 may be greatly increased over the ELAT 10. The pulsed evaluate concept allows greater functionality because the input functions are not directly limited by the size of the pull-down stack 20'.

Figure 3:
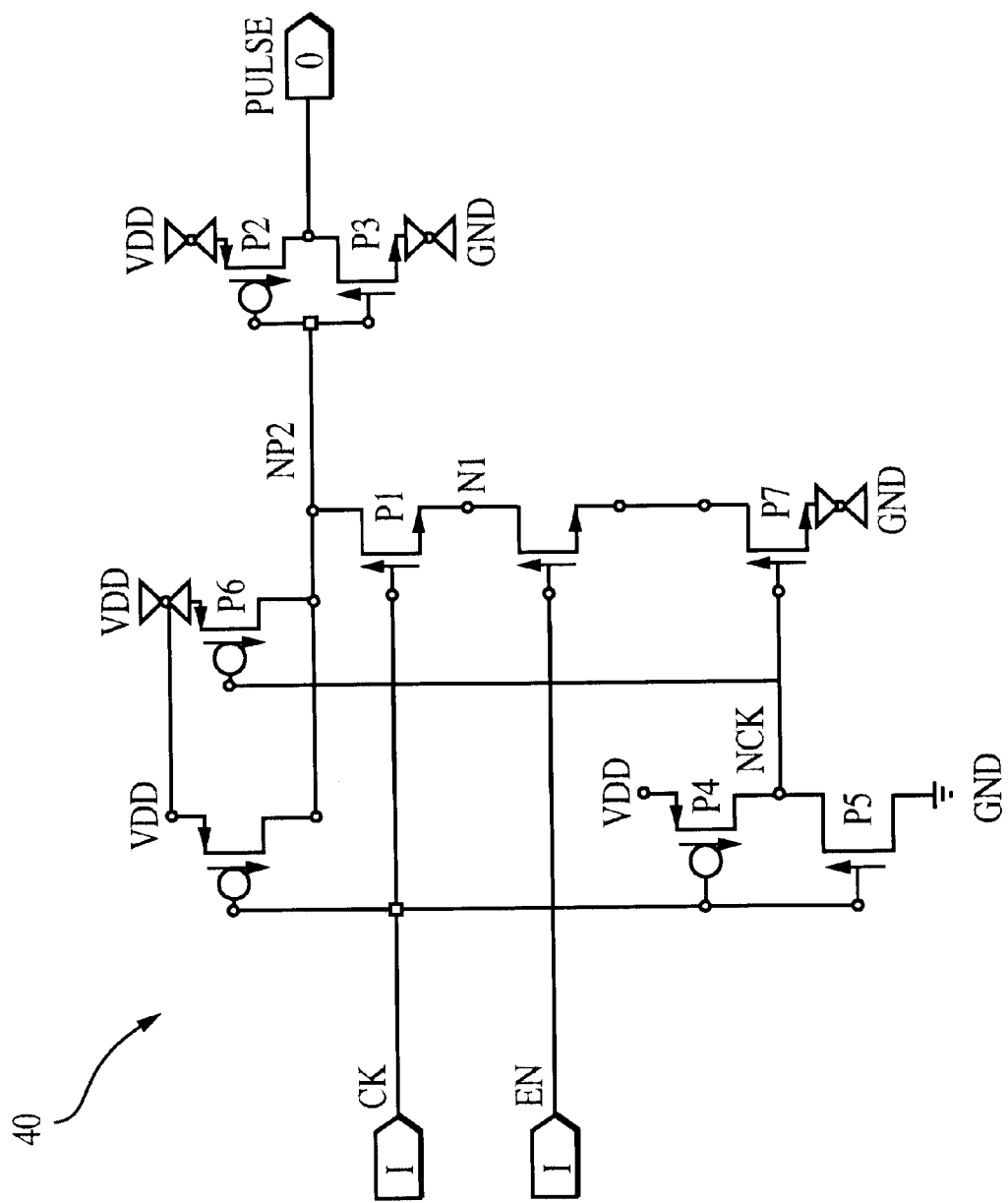
FIG. 3 is a logic block diagram of an embodiment of a pulse generator utilized in the new ELAT in FIG. 2.

A feature of the new ELAT 30 is the use of a standard pulse generator 40, an embodiment of which is shown in FIG. 3. Pulse generators are used in many subcircuits, and standard pulse generators are carefully designed from controlled parameters. Using standard pulse generators in the new ELAT 30 ensures the new ELAT 30 will perform within these controlled parameters. Using standard pulse generators also allows for the sharing of pulse generators among multiple ELATs in multiple-bit configurations.

The pulse generator 40 shown in FIG. 3 is a single enable pulse generator that produces a pulse on the rising clock signal CK when the enable EN is high. The signal CK is driven by the clock signal DCK and the enable signal EN is driven by the input IN.

Figure 4:
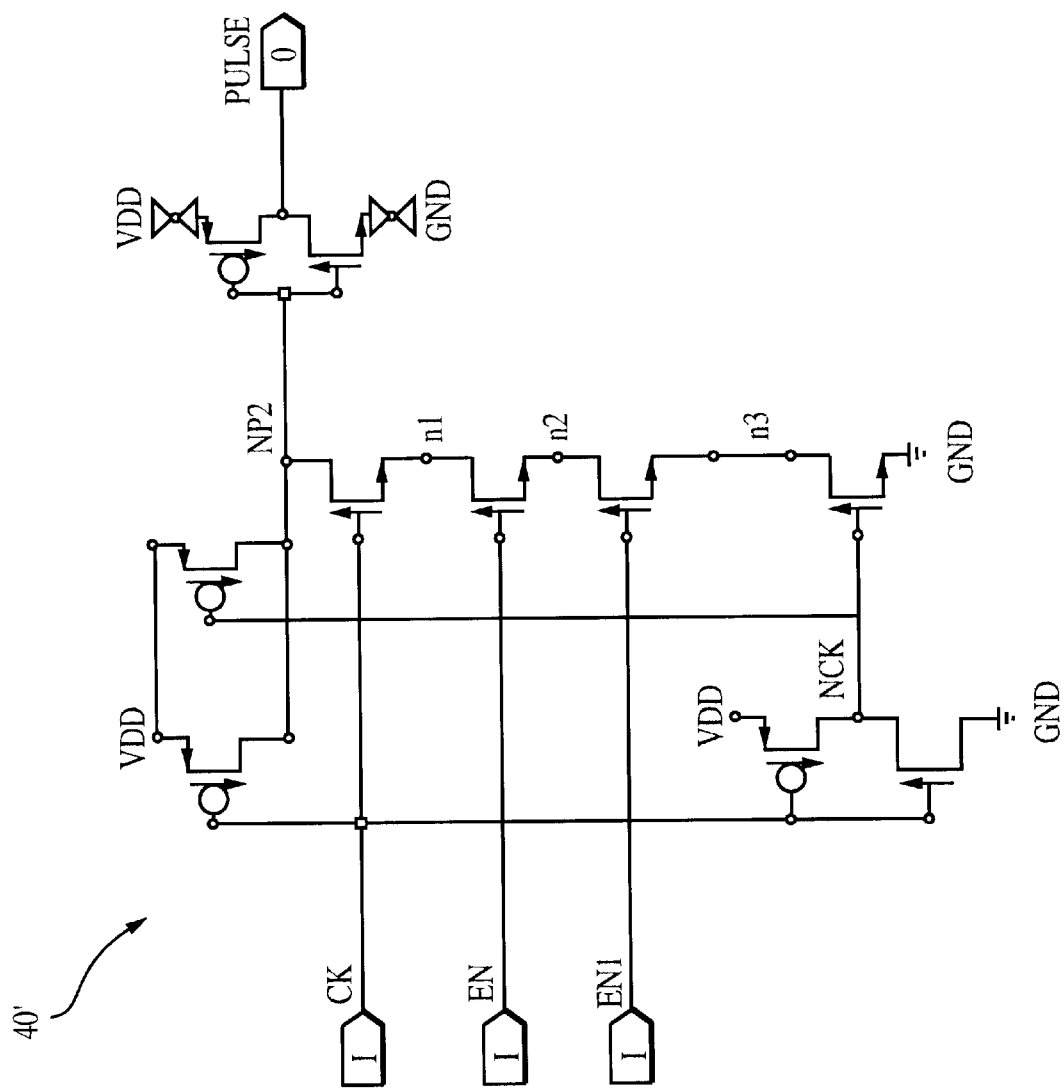
FIG. 4 is a logic block diagram of an embodiment of a Dual Enable ANDing pulse generator which can be utilized in the new ELAT.
Figure 5:
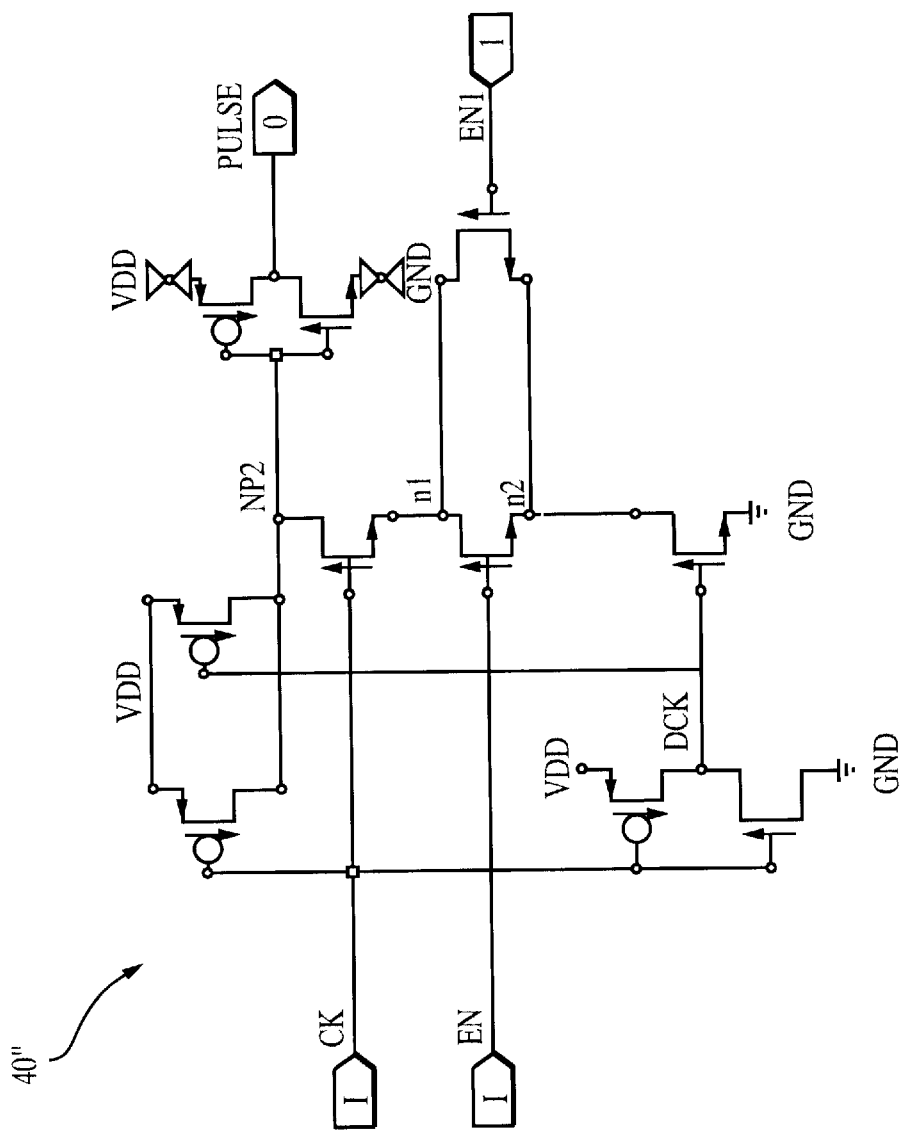
FIG. 5 is a logic block diagram of an embodiment of a Dual Enable ORing pulse generator which can be utilized in the new ELAT.
Figure 6D:
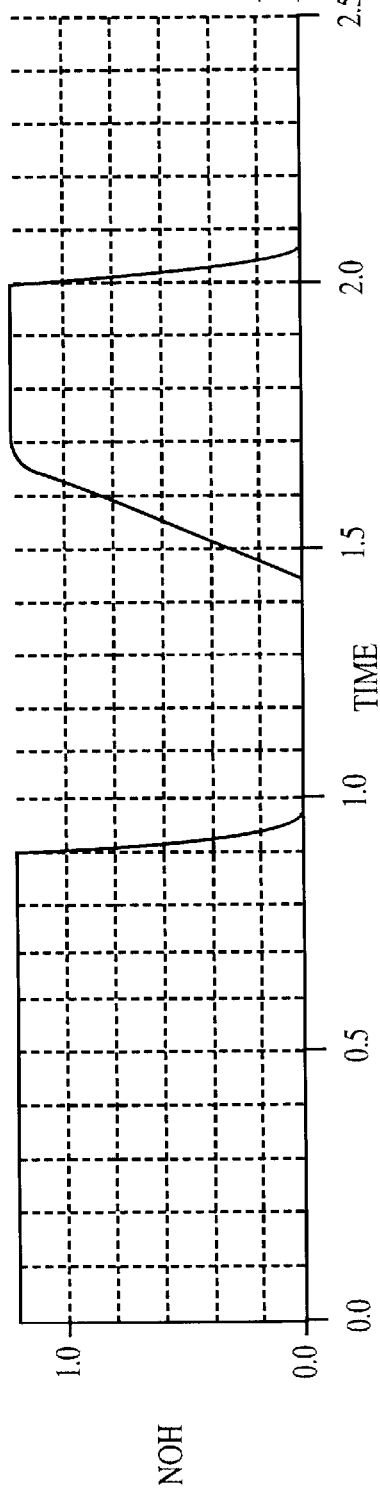
Figure 6E:
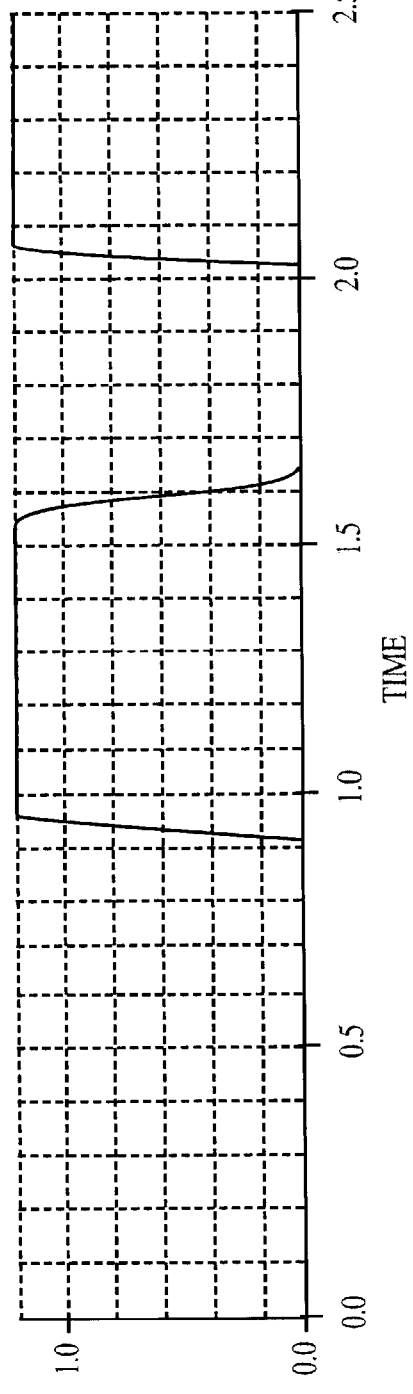

The pulse generator 40 incorporated in the new ELAT 30 can incorporate two-input functions as well. This allows two additional types of pulse generators, including the dual enable AND pulse generator 40' shown in FIG. 4 and the dual enable ORing pulse generator 40" shown in FIG. 5 The dual enable AND pulse generator 40' in FIG. 4 produces a pulse on the rising signal CK if the enable signals EN and EN1 are high. The dual enable ORing pulse generator 40" in FIG. 5 produces a pulse on the rising signal of CK if the enable signal EN and/or the enable signal EN1 are high.

With reference to FIGS. 6a–6e, the following description of the performance of the new ELAT 30 shown in FIG. 2 assumes that the static input 'IN' is high (logic 1). When the clock waveform DCK is low (logic 0), the FET E1 is biased closed, which in turn causes the signal NOH to be high. The signal NOH in turn biases the FETs E3 and E5 open and closed, respectively, which forces the output Z low (see time=0.0 in FIGS. 6a–6e). When the clock waveform DCK rises to high, the FET E1 is biased open and the pulse generator 40 generates a pulse. This pulse biases the FET E6 closed, which forces the signal NOH low. The signal NOH in turn now biases the FETs E3 and E5 closed and open respectively, which forces the output Z high (see time=0.9 in FIG. 6). The output Z also feeds back to FETs E2 and E4, biasing them closed and open, respectively. Therefore, the feedback FETs E2 and E4 act as a holder, holding NOH at its current value (in this case, NOH=logic 0) until the clock waveform DCK falls to logic 0.

The pulse remains high for one gate delay, at which point it falls to logic 0. When the pulse is low, the FET E6 is biased open, thereby removing the associated ground from NOH (see time=1.05 in FIG. 6). Then, when the clock waveform DCK falls, the FET E1 is biased closed and NOH rises to high. As described above, this in turn biases the FETs E3 and E5 open and closed, respectively, thereby forcing the output Z low (see time=1.6 in FIG. 6). Again, the output Z feeds back to the holder FETs E2 and E4, biasing them open and closed, respectively.

With reference to FIG. 3, and again assuming that the enable EN is high (i.e, that input 'IN' is high, since IN=EN), NP2 will fall as the clock waveform DCK rises (since DCK =CK) and the output pulse will rise (see time=0.9 in FIG. 6). The rising CK will bias FET P1 closed, thereby driving NP2 low or to ground. The low NP2 in turn biases the FETs P2 and P3 closed and open, respectively, forcing the output pulse high. However, the rising CK also biases FETs P4 and P5 closed and open, respectively, forcing the signal NCK low. The signal NCK in turn biases the FETs P6 and P7 closed and open, respectively, which removes the ground from NP2 and forces NP2 high. The FETs P2 and P3 are biased open and closed, respectively, forcing the pulse output from the pulse generator low again (see time=1.05 in FIG. 6). The gate delay caused by FETs P4–P7 delays the fall of output pulse, thereby producing a pulse of the width seen in the timing diagram of FIG. 6 (see time=0.9 to 1.25).

Figure 7:
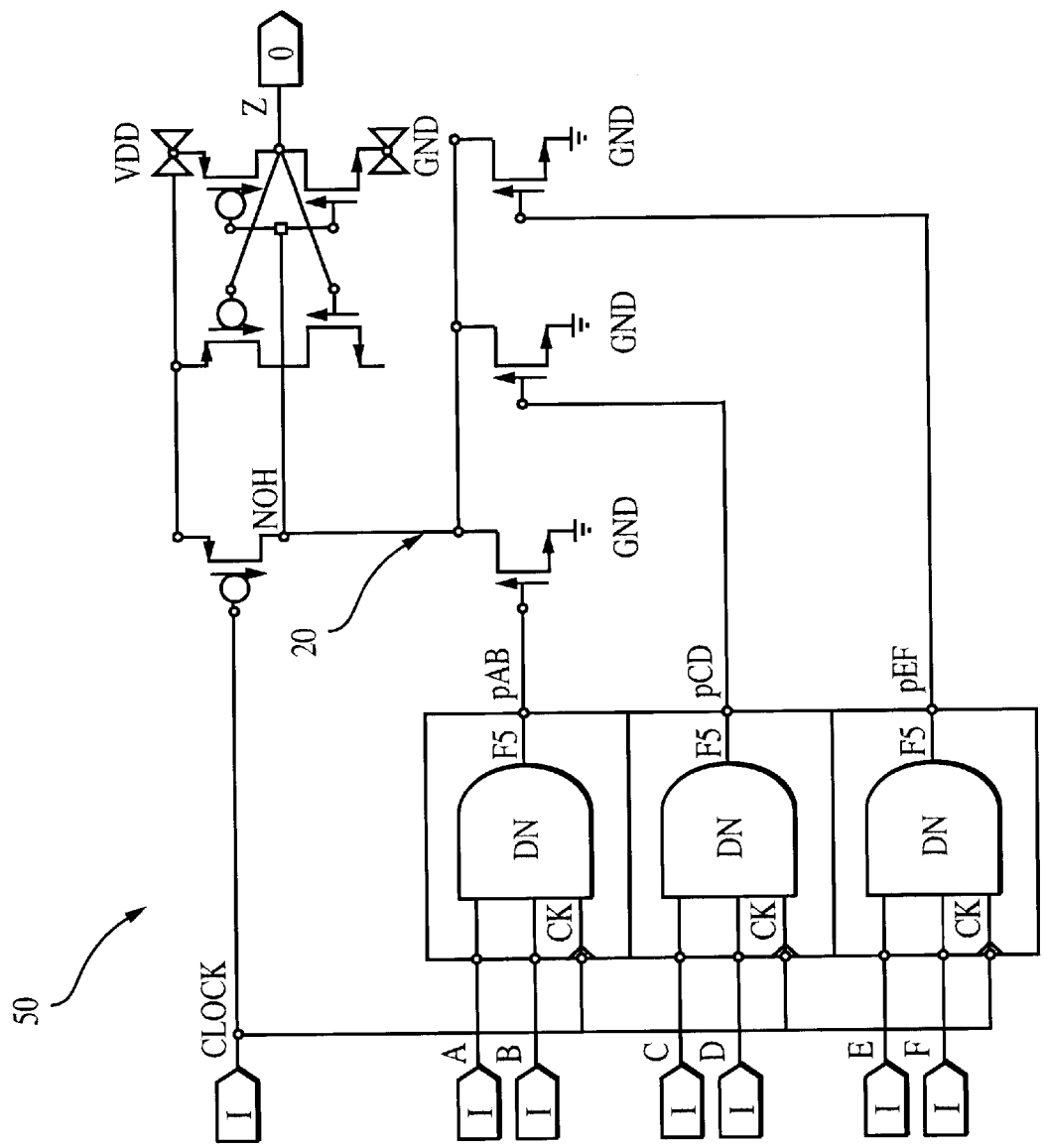
FIG. 7 is a logic block diagram of an embodiment of a 2 AND 3 OR ELAT.

The configuration shown in FIG. 7 is a 6-input wide AND/OR (2 AND 3 OR) ELAT 50. The function that results from this configuration is Z=A*B+C*D+E*F. In other words, when inputs A and B are high, C and D are high, and/or E and F are high, a pulse will be generated when the clock waveform CLOCK rises. The generated pulse will ground the pull-down stack 20", forcing NOH low and output Z high. Otherwise, the configuration in FIG. 7 behaves as described above for the new ELAT 30 in FIG. 2.

Figure 8:
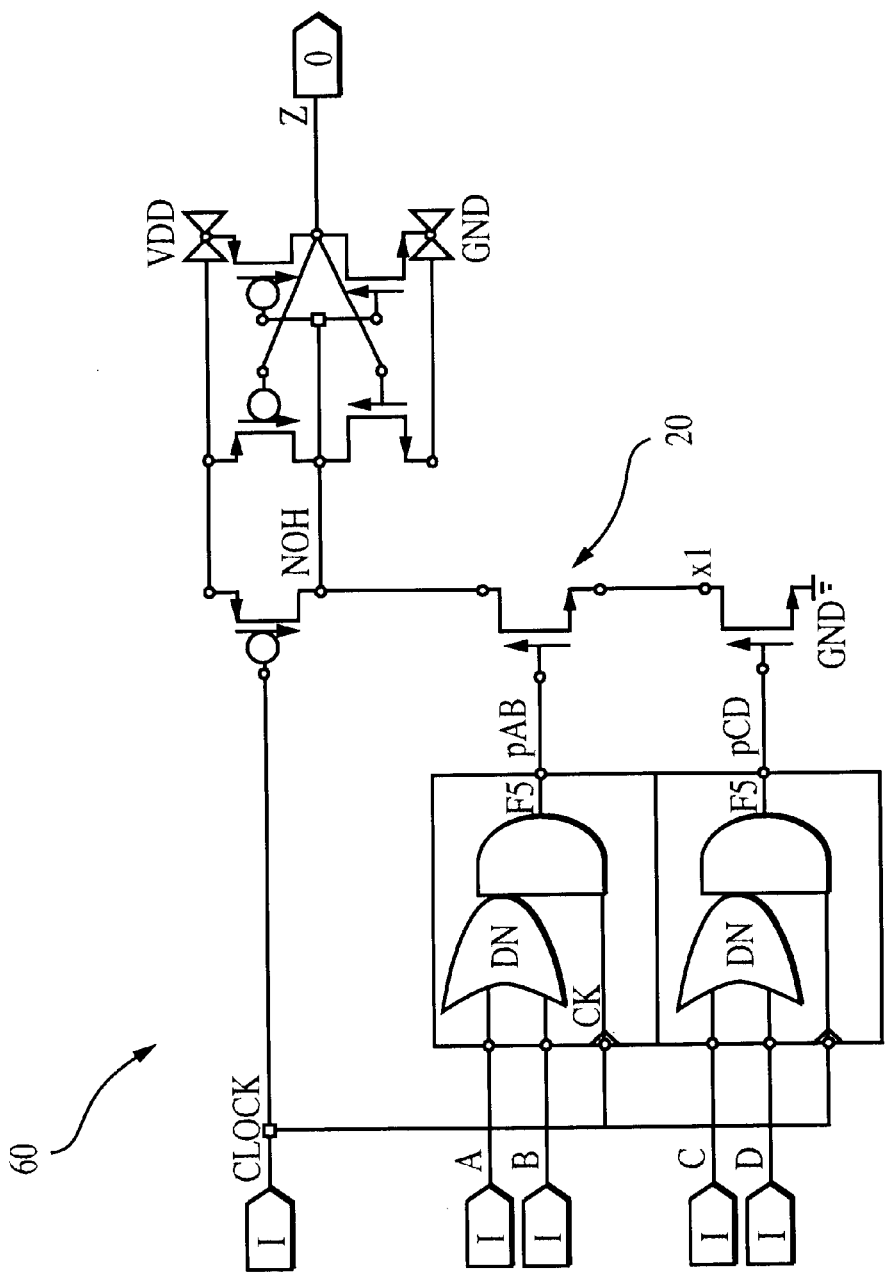
FIG. 8 is a logic block diagram of an embodiment of a 2 OR 2 AND ELAT.

The configuration illustrated by FIG. 8 is a 4-input wide OR/AND (2 OR 2 AND) ELAT 60. The function that results from this configuration is Z=(A+B)*(C+D). In other words, when inputs A and/or B are high, a pulse pAB is generated and when inputs C and/or D are high a pulse pCD is generated. If pAB and pAB pulse, the pull-down stack 20'" will force NOH low and output Z high. Otherwise, the configuration in FIG. 8 behaves as described above for the new ELAT 30 in FIG. 2.

Figure 9:
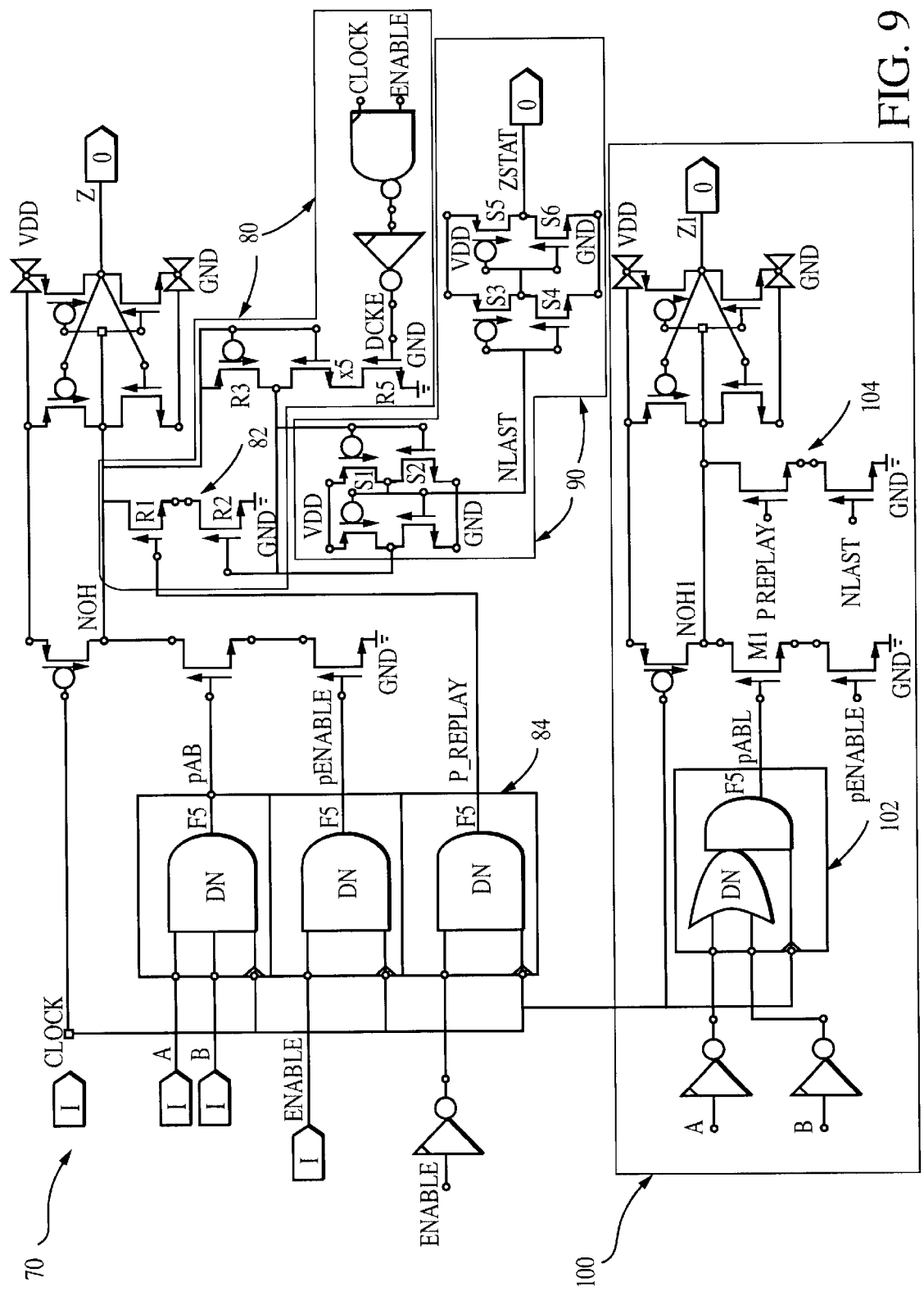
FIG. 9 is a logic block diagram of an embodiment of a replaying, mousetrap ELAT with a static output.

FIG. 9 shows a new ELAT 70 capable of replaying the last cycle's value. Replaying of the last cycle's value is useful in the case of a stall. If a stall is detected, the last cycle's value will be replayed until there is no longer a stall. Since a stall may last a number of cycles, the replaying circuitry must be able to hold the last cycle's value for at least as long as time. This latched value is indicated by the signal LAST shown in FIG. 9. The ELAT 70 will produce the function Z=A AND B on a rising CLOCK if ENABLE is high (logic 1). If a stall is detected, ENABLE will drop to low (logic 0) and the ELAT 70 will produce the function Z=LAST on a rising CLOCK.

Replaying circuitry 80 utilizes the pulsed evaluate concept discussed previously to reduce the size of replaying pull-down stack 82. When a stall is detected, ENABLE will drop to low and a P_REPLAY pulse generator 84 will produce a pulse. The P_REPLAY pulse will bias a FET R1 closed. If the last cycle's value was Z high (logic 1), then NOH will be low (logic 0). When NOH is low, a FET R3 will be biased closed, which will cause LAST to go high. Since a FET R5 will remain open until ENABLE goes high, due to the inverted NAND of ENABLE and CLOCK, LAST will hold at high (i.e., this value is latched). With LAST high, a FET R2 will be biased closed and NOH will be driven to ground on every rising CLOCK and driven to supply on low CLOCK through the pull-up PFET until ENABLE goes high (i.e., the stall is no longer detected). Therefore, the replaying circuitry 80 will replay the last cycle's value (in this case, Z is high) until the stall is no longer detected.

Since the replaying circuitry 80 is included in the ELAT 70 in FIG. 9, a static output can be generated in addition to the dynamic outputs. The latched value LAST is used by the static output circuitry 90 to produce the static output ZSTAT. If LAST is high, then a FET S2 will be biased closed, and the signal NLAST will be low. If NLAST is low, FETs S3 and S6 will be biased closed and ZSTAT will be grounded, i.e., ZSTAT will be forced low. Likewise, if LAST is high, then FETs S1, S4, and S6 will be biased closed and ZSTAT will be forced high. Since LAST holds its value for a long time, as discussed above, ZSTAT will be a static output.

Expanding a single rail ELAT to a dual rail ELAT involves implementing the inverse function in another pull-down circuit. The ability to implement complex functions works to good advantage here also, allowing a wider variety of input functions and their inverses to be constructed. Accordingly, the ELAT 70 in FIG. 9 also includes circuitry to produce a dual rail output, specifically mousetrap circuitry 100. The mousetrap circuitry 100 produces a second dynamic output Z1. The output Z1 will be the inverse of the output Z; i.e., if Z goes high on the rising clock, then Z1 will remain low on the rising clock (all outputs are low when the clock is low). In other words, the mousetrap circuitry 100 is the "not" part of the ELAT 70 in FIG. 9. The advantage of using mousetrap logic, i.e. dual-rail circuitry, is that it is self-timed, so that when the output Z is high, the data is known to be good, since Z1 will be low at the same time. In dual rail circuitry, one output will always fire (go high) signaling the end of a computation. In single rail circuitry, the output may not fire and therefore, the end of a computation cannot be determined sooner than the end of the clock phase.

In the mousetrap circuitry 100, if either inputs A or B are low, then a pABL pulse generator 102 will generate a pulse on the rising CLOCK. The pABL pulse will bias a FET M1 closed, and if ENABLE is high, the output Z1 will be forced high as described previously for the new ELAT 30. If ENABLE is low, the second pull-down stack 104 on the mousetrap circuitry 100 will cause an output of Z1=NLAST to be generated as described above with the replaying circuitry 80 and the output Z.

It is particularly important to note, with reference to FIG. 9, that for multiple-bit banks of ELATs, pulse generators and enable gates can often be shared among different bank bits, further reducing clock load and device size. As seen in FIG. 9, even within a one-bit ELAT 70, the PENABLE pulse generator 78 and the P_REPLAY pulse generator 84 were shared between the output Z portion of the ELAT 70 and the mousetrap circuitry 100 or "not" part of the ELAT 70. This sharing of pulse generators simplifies the circuit and reduces clock load and device size.

While the invention has been disclosed in this patent application by reference to the details of preferred embodiments of the invention, it is to be understood that the disclosure is intended in an illustrative rather than in a limiting sense, as it is contemplated that modifications will readily occur to those skilled in the art, within the spirit of the invention and the scope of the appended claims.

We claim:

1. An apparatus for capturing a static input and converting the static input to a dynamic signal comprising:
   a logic circuit that captures a first static input signal and at least one clock waveform input signal, the logic circuit comprising:
      a first pulse generator, wherein the first pulse generator evaluates the first static input signal and the at least one clock waveform input signal to generate a first self-timed pulse; and
      additional circuitry for receiving the first self-timed pulse and generating a first dynamic signal output.

2. The apparatus according to claim 1, wherein the additional circuitry includes a signal path and a pull-down stack with a first FET between the signal path and ground.

3. The apparatus according to claim 2, wherein the first FET is an NFET that is driven by the first pulse generator, whereby the first pulse biases the NFET closed so that the pull-down stack and the signal path are grounded.

4. The apparatus according to claim 2, wherein the additional circuitry further includes a second FET between a source voltage and the signal path, wherein the second FET is driven by the at least one clock waveform input signal.

5. The apparatus according to claim 1, wherein said logic circuit further comprises mousetrap circuitry that produces a second dynamic signal output that is a logic inverse of the first dynamic signal output.

6. The apparatus according to claim 1, wherein the produced first dynamic signal output is high and is held high until the clock waveform signal falls to logic zero.

7. An apparatus for capturing a static input and converting the static input to a dynamic signal comprising:
   a logic circuit that captures a first static input signal and at least one clock waveform input signal, the logic circuit comprising:
      a first pulse generator, wherein the first pulse generator evaluates the first static input signal and the at least one clock waveform input signal to generate a first pulse, wherein the first pulse is used to determine when to produce a first dynamic signal output;
      a signal path and a pull-down stack with a first FET between the signal path and ground;
      a second FET between a source voltage and the signal path, wherein the second FET is driven by the at least one clock waveform input signal; and
      a third FET between the voltage source and the first dynamic signal output and a fourth FET between the first dynamic signal output and the ground, whereby a signal on the signal path drives the third FET and the fourth FET.

8. The apparatus according to claim 7, wherein said logic circuit further comprises a holder driven by the first dynamic signal output, whereby the holder feeds back to the signal path to latch the signal on the signal path at a current value.

9. An apparatus for capturing a static input and converting the static input to a dynamic signal comprising:
   a logic circuit that captures a first static input signal and at least one clock waveform input signal, the logic circuit comprising:
      a first pulse generator, wherein the first pulse generator evaluates the first static input signal and the at least one clock waveform input signal to generate a first pulse, wherein the first pulse is used to determine when to produce a first dynamic signal output; and wherein said logic circuit further captures a second static input signal and the first pulse generator is a dual enable ANDing pulse generator that evaluates the first static input signal, the second static input signal, and the at least one clock waveform input signal to generate the first pulse.

10. An apparatus for capturing a static input and converting the static input to a dynamic signal comprising:
a logic circuit that captures a first static input signal and at least one clock waveform input signal, the logic circuit comprising:
a first pulse generator, wherein the first pulse generator evaluates the first static input signal and the at least one clock waveform input signal to generate a first pulse, wherein the first pulse is used to determine when to produce a first dynamic signal output; and
wherein said logic circuit further captures a second static input signal and the first pulse generator is a dual enable ORing pulse generator that evaluates the first static input signal, the second static input signal, and the at least one clock waveform input signal to generate the first pulse.

11. An apparatus for capturing a static input and converting the static input to a dynamic signal comprising:
a logic circuit that captures a first static input signal and at least one clock waveform input signal, the logic circuit comprising:
a first pulse generator, wherein the first pulse generator evaluates the first static input signal and the at least one clock waveform input signal to generate a first pulse, wherein the first pulse is used to determine when to produce a first dynamic signal output; and
a second pulse generator, wherein:
said logic circuit further captures a second static input signal, a third static input signal and a fourth static input signal;
the first pulse generator is a dual enable ORing pulse generator that evaluates the first static input signal, the second static input signal, and the at least one clock waveform input signal to generate the first pulse; and
the second pulse generator is a dual enable ORing pulse generator that evaluates the third static input signal, the fourth static input signal, and the at least one clock waveform input signal to generate a second pulse.

12. The apparatus according to claim 11, wherein said logic circuit further comprises a pull-down stack with two FETs in series between a signal path and ground.

13. The apparatus according to claim 12, wherein the two FETs in series are a first NFET, driven by the first pulse generator, and a second NFET, driven by the second pulse generator, whereby the first pulse biases the first NFET closed and the second pulse biases the second NFET closed and the pull-down stack and the signal path are grounded when the first NFET and the second NFET are both biased closed.

14. An apparatus for capturing a static input and converting the static input to a dynamic signal comprising:
a logic circuit that captures a first static input signal and at least one clock waveform input signal, the logic circuit comprising:
a first pulse generator, wherein the first pulse generator evaluates the first static input signal and the at least one clock waveform input signal to generate a first pulse, wherein the first pulse is used to determine when to produce a first dynamic signal output;

a second pulse generator; and
a third pulse generator, wherein:
said logic circuit further captures a second static input signal, a third static input signal, a fourth static input signal, a fifth static input signal and a sixth static input signal;
the first pulse generator is a dual enable ANDing pulse generator that evaluates the first static input signal, the second static input signal, and the at least one clock waveform input signal to generate the first pulse;
the second pulse generator is a dual enable ANDing pulse generator that evaluates the third static input signal, the fourth static input signal, and the at least one clock waveform input signal to generate a second pulse; and
the third pulse generator is a dual enable ANDing pulse generator that evaluates the fifth static input signal, the sixth static input signal, and the at least one clock waveform input signal to generate a third pulse.

15. The apparatus according to claim 14, wherein said logic circuit further comprises a pull-down stack with three FETS in parallel between a signal path and ground, the three FETs comprising:
a first NFET, driven by the first pulse generator;
a second NFET, driven by the second pulse generator; and
a third NFET, driven by the third pulse generator, whereby the first pulse biases the first NFET closed, the second pulse biases the second NFET closed, and the third pulse biases the third NFET closed and the pull-down stack and the signal path are grounded when the either the first NFET, the second NFET or the third NFET are biased closed.

16. An apparatus for capturing a static input and converting the static input to a dynamic signal comprising:
a logic circuit that captures a first static input signal and at least one clock waveform input signal, the logic circuit comprising:
a first pulse generator, wherein the first pulse generator evaluates the first static input signal and the at least one clock waveform input signal to generate a first pulse, wherein the first pulse is used to determine when to produce a first dynamic signal output; and
mousetrap circuitry that produces a second dynamic signal output that is a logic inverse of the first dynamic signal output, wherein:
said logic circuit further captures a second static input signal; and
the mousetrap circuitry comprises a second pulse generator,
wherein the second pulse generator evaluates an inverse of the first static input signal, an inverse of the second static input signal and the at least one clock waveform input signal to generate a second pulse, wherein the second pulse is used to determine when to produce the second dynamic signal output.

17. An apparatus for capturing a static input and converting the static input to a dynamic signal comprising:
a logic circuit that captures a first static input signal and at least one clock waveform input signal, the logic circuit comprising:
a first pulse generator, wherein the first pulse generator evaluates the first static input signal and the at least one clock waveform input signal to generate a first pulse, wherein the first pulse is used to determine when to produce a first dynamic signal output; and replaying circuitry that latches the value of the first dynamic signal output when a stall is detected, wherein the replaying circuitry replays the first dynamic signal output from the latched value.

18. The apparatus according to claim 17, wherein said replaying circuitry produces a static output.

19. A method for capturing a static input and converting the static input to a dynamic signal comprising the steps of:

receiving a first static input signal;

receiving a clock waveform input signal, wherein the first static input signal and the clock waveform input signal are received in a logic circuit;

pulse evaluating the first static input signal and the clock waveform input signal, wherein the pulse evaluating step produces a self-timed pulse; and generating a dynamic signal output based on the pulse evaluation of the first static input signal and the clock waveform input signal.

20. The method according to claim 19, wherein the pulse evaluating step further comprises the steps of:

determining if the clock waveform input signal is rising while the first static input signal is high; and generating a pulse for a clock cycle based on a determination that the clock waveform input signal is rising while the first static input signal is high.

21. The method according to claim 20, wherein the generating step further comprises the step of:

grounding a pull-down stack if the pulse is generated during pulse evaluation step, wherein the grounding of the pull-down stack causes the dynamic signal output to be high.

22. An apparatus for capturing a static input and converting the static input to a dynamic signal comprising:

a logic circuit that captures a first static input signal and at least one clock waveform input signal, the logic circuit comprising:

a first pulse generator, wherein the first pulse generator evaluates the first static input signal and the at least one clock waveform input signal to generate a first self-timed pulse, wherein the first pulse generator includes one or more field-effect transistors; and additional circuitry for receiving the first self-timed pulse and generating a first dynamic signal output.

* * * * *